(12) United States Patent
Hoshi et al.

(10) Patent No.: US 10,644,145 B2
(45) Date of Patent: May 5, 2020

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yasuyuki Hoshi, Matsumoto (JP); Yuichi Harada, Matsumoto (JP); Akimasa Kinoshita, Matsumoto (JP); Yasuhiko Oonishi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/284,007

(22) Filed: Oct. 3, 2016

(65) Prior Publication Data
US 2017/0025528 A1 Jan. 26, 2017

Related U.S. Application Data

(63) Continuation of application No. PCT/JP2015/072907, filed on Aug. 13, 2015.

(30) Foreign Application Priority Data

Sep. 11, 2014 (JP) .................. 2014-185707

(51) Int. Cl.
*H01L 29/78* (2006.01)
*H01L 29/423* (2006.01)
(Continued)

(52) U.S. Cl.
CPC .... *H01L 29/7811* (2013.01); *H01L 21/02378* (2013.01); *H01L 21/02529* (2013.01);
(Continued)

(58) Field of Classification Search
CPC ......... H01L 29/78; H01L 29/08; H01L 29/06; H01L 21/02; H01L 29/36; H01L 29/16;
(Continued)

(56) References Cited

U.S. PATENT DOCUMENTS 5,635,734 A 6/1997 Takayanagi et al.
6,821,886 B1 11/2004 Layadi et al.
(Continued)

FOREIGN PATENT DOCUMENTS

EP 2387077 A2 11/2011
JP H07-254699 A 10/1995
(Continued)

*Primary Examiner* — Brigitte A Paterson
(74) *Attorney, Agent, or Firm* — Rabin & Berdo, P.C.

(57) ABSTRACT

A semiconductor device, including a semiconductor substrate, a semiconductor layer disposed on a surface of the semiconductor substrate, a first semiconductor region disposed in the semiconductor layer at a surface thereof, a source region and a second semiconductor region disposed in the first semiconductor region at a surface thereof, a source electrode contacting the source region and the second semiconductor region, a gate insulating film disposed on the surface of the semiconductor layer and covering a portion of the first semiconductor region between the source region and the semiconductor layer, a gate electrode disposed on a surface of the gate insulating film, a drain electrode disposed on another surface of the semiconductor substrate, and a third semiconductor region, which has an impurity concentration higher than that of the first semiconductor region, formed in the semiconductor layer at the surface thereof and being electrically connected to the source electrode.

8 Claims, 8 Drawing Sheets

(51) Int. Cl.
*H01L 29/10* (2006.01)
*H01L 21/02* (2006.01)
*H01L 29/06* (2006.01)
*H01L 29/08* (2006.01)
*H01L 29/36* (2006.01)
*H01L 29/417* (2006.01)
*H01L 29/66* (2006.01)
*H01L 29/16* (2006.01)

(52) U.S. Cl.
CPC .... *H01L 21/02634* (2013.01); *H01L 29/0619* (2013.01); *H01L 29/0684* (2013.01); *H01L 29/0865* (2013.01); *H01L 29/1079* (2013.01); *H01L 29/1095* (2013.01); *H01L 29/36* (2013.01); *H01L 29/41741* (2013.01); *H01L 29/4238* (2013.01); *H01L 29/42372* (2013.01); *H01L 29/66712* (2013.01); *H01L 29/0661* (2013.01); *H01L 29/1608* (2013.01); *H01L 29/66068* (2013.01)

(58) Field of Classification Search
CPC ....... H01L 29/66; H01L 29/10; H01L 29/417; H01L 29/7811; H01L 29/0619; H01L 29/0684; H01L 29/0865; H01L 29/01079; H01L 29/1095; H01L 29/41741; H01L 29/4238; H01L 29/66712; H01L 29/0661; H01L 29/1608; H01L 29/66068; H01L 21/02378; H01L 21/02529; H01L 21/02634
See application file for complete search history.

(56) References Cited

U.S. PATENT DOCUMENTS

| | | | |
|---|---|---|---|
| 9,960,235 | B2 | 5/2018 | Hoshi et al. |
| 2010/0140697 | A1 | 6/2010 | Yedinak et al. |
| 2011/0233544 | A1 | 9/2011 | Honda |
| 2011/0233666 | A1 | 9/2011 | Lui et al. |
| 2013/0020587 | A1* | 1/2013 | Hino .................. H01L 29/1095 257/77 |
| 2013/0062624 | A1 | 3/2013 | Tsuchiya et al. |
| 2013/0234161 | A1 | 9/2013 | Shimizu et al. |
| 2014/0299887 | A1 | 10/2014 | Matocha et al. |

FOREIGN PATENT DOCUMENTS

| | | |
|---|---|---|
| JP | 2009-004707 A | 1/2009 |
| JP | 2011-210801 A | 10/2011 |
| JP | 2013-102106 A | 5/2013 |
| JP | 2013-187302 A | 9/2013 |
| JP | 2014-082521 A | 5/2014 |

* cited by examiner

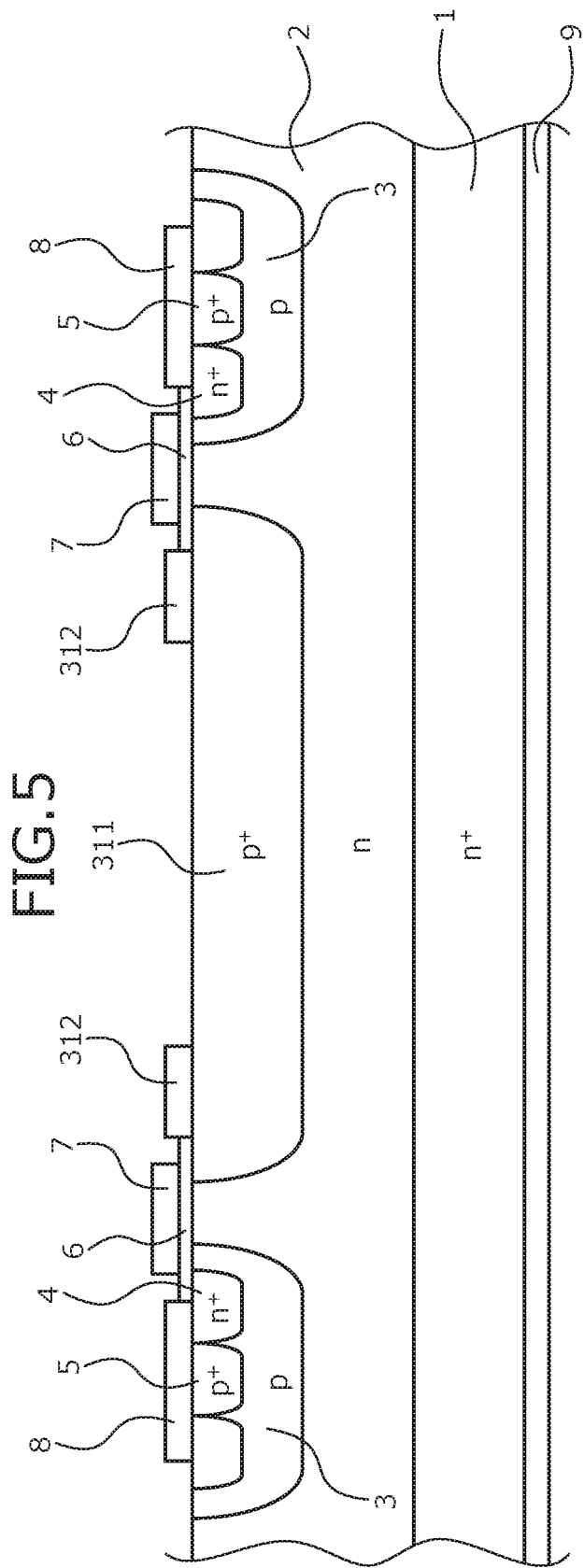

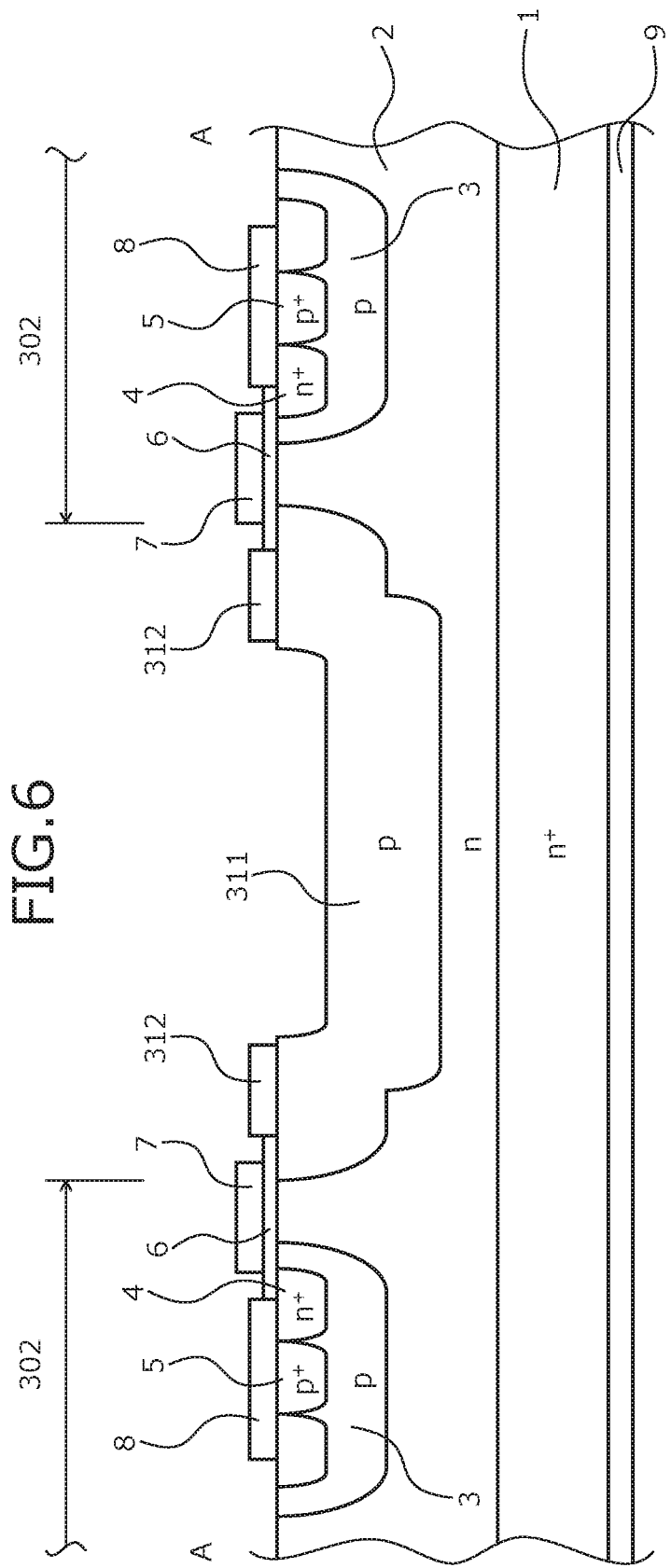

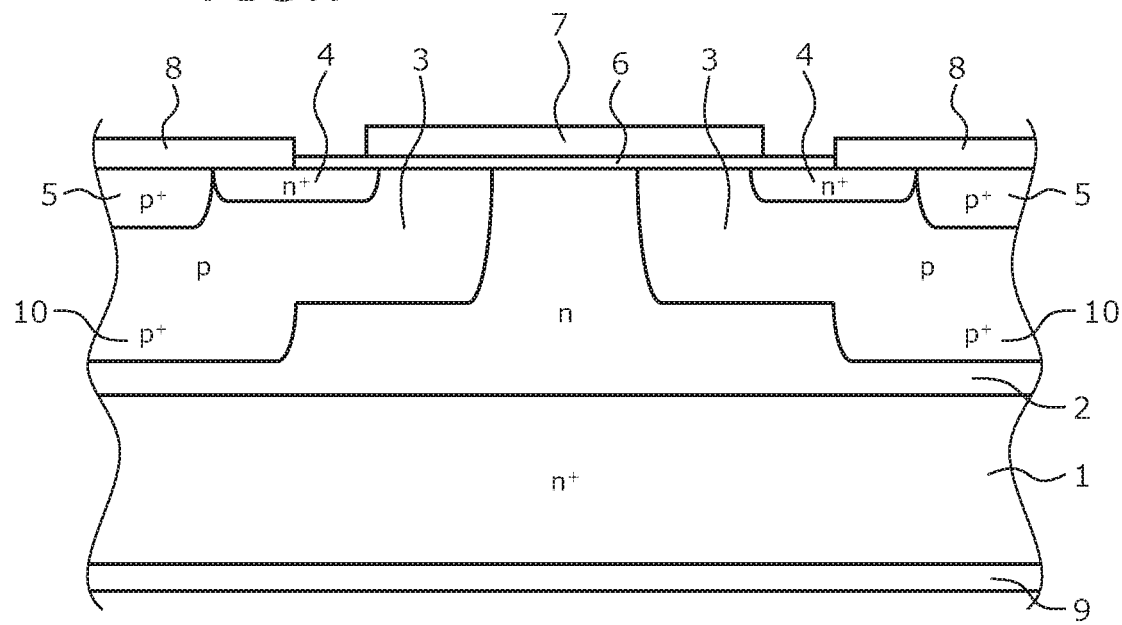
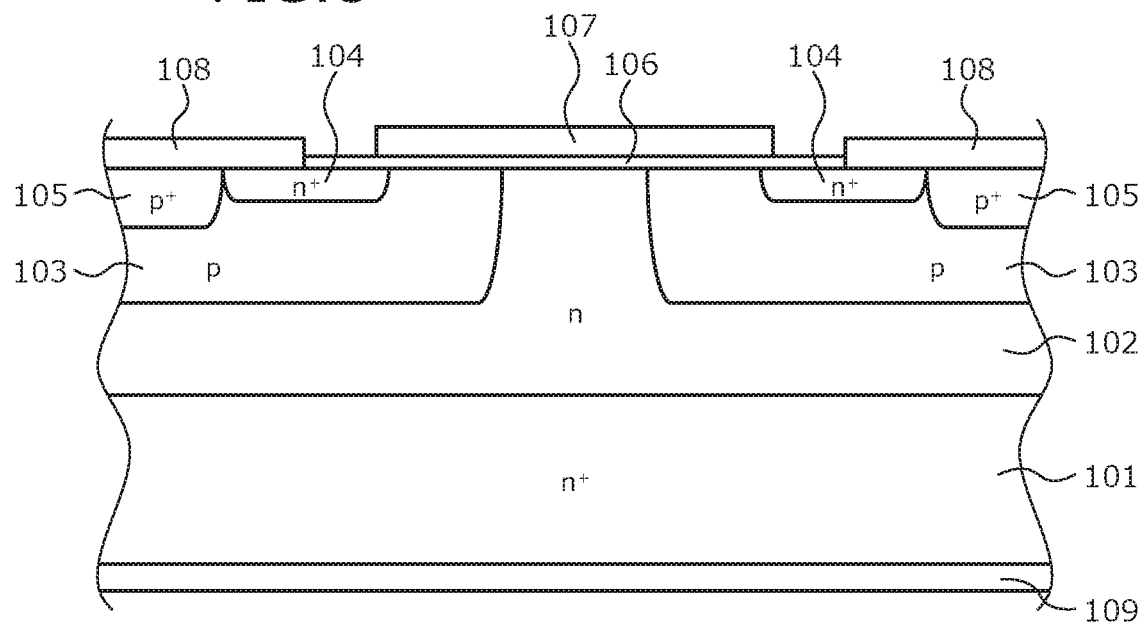

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/072907 filed on Aug. 13, 2015 which claims priority from a Japanese Patent Application No. 2014-185707 filed on Sep. 11, 2014, the contents of which are incorporated herein by reference.

BACKGROUND OF THE INVENTION

1. Field of the Invention

The embodiments discussed herein are related to a semiconductor device and a method of manufacturing a semiconductor device.

2. Description of the Related Art

FIG. 8 is a cross-sectional view of a first example of a conventional semiconductor device. As depicted in FIG. 8, the semiconductor device includes an n-type silicon carbide semiconductor layer 102 on a front surface of an $n^+$-type silicon carbide semiconductor substrate 101. Plural p-type semiconductor regions 103 are disposed in a surface region of the n-type silicon carbide semiconductor layer 102. An $n^+$-type source region 104 and a $p^+$-type contact region 105 are disposed in a surface region of the p-type semiconductor region 103. A gate electrode 107 is disposed through a gate insulating film 106 on the p-type semiconductor region 103 between the $n^+$-type source region 104 and the n-type silicon carbide semiconductor layer 102. A source electrode 108 contacts the $n^+$-type source region 104 and the $p^+$-type contact region 105. A drain electrode 109 is disposed on a back surface of the $n^+$-type silicon carbide semiconductor substrate 101 (see, for example, Japanese Laid-Open Patent Publication No. 2013-187302).

FIG. 9 is a cross-sectional view of a second example of the conventional semiconductor device. As depicted in FIG. 9, the semiconductor device includes an n-type silicon carbide semiconductor layer 202 on a front surface of an $n^+$-type silicon carbide semiconductor substrate 201. Plural $p^+$-type base regions 210 are disposed in a surface region of the n-type silicon carbide semiconductor layer 202. A $p^+$-type silicon carbide semiconductor layer 211 is disposed on the $p^+$-type base region 210 and the n-type silicon carbide semiconductor layer 202. In the $p^+$-type silicon carbide semiconductor layer 211, an n-type semiconductor region 212 is disposed on the n-type silicon carbide semiconductor layer 202 between the $p^+$-type base region 210 and the $p^+$-type base region 210 that are adjacent to each other. In the $p^+$-type silicon carbide semiconductor layer 211, a p-type semiconductor region 203, an $n^+$-type source region 204, and a $p^+$-type contact region 205 are disposed on the $p^+$-type base regions 210. A gate electrode 207 is disposed through a gate insulating film 206 on the p-type semiconductor region 203 between the $n^+$-type source region 204 and the n-type semiconductor region 212. A source electrode 208 contacts the $n^+$-type source region 204 and the $p^+$-type contact region 205. A drain electrode 209 is disposed on a back surface of the $n^+$-type silicon carbide semiconductor substrate 201 (see, for example, Japanese Laid-Open Patent Publication No. 2013-102106).

SUMMARY OF THE INVENTION

According to one aspect of the present invention, a semiconductor device includes a semiconductor substrate of a first conductivity type, comprising silicon carbide; a semiconductor layer of the first conductivity type, disposed on a first principal surface of the semiconductor substrate, the semiconductor layer having an impurity concentration lower than that of the semiconductor substrate; a first semiconductor region of a second conductivity type, disposed in a surface region of the semiconductor layer or on a surface of the semiconductor layer; a source region of the first conductivity type, disposed in a surface region of the first semiconductor region; a second semiconductor region of the second conductivity type, disposed in the surface region of the first semiconductor region, the second semiconductor region having an impurity concentration higher than that of the first semiconductor region; a source electrode disposed to contact the source region and the second semiconductor region; a gate insulating film disposed on a surface of the first semiconductor region, at a region between the source region and the semiconductor layer of the first conductivity type adjacent to the first semiconductor region; a gate electrode disposed on a surface of the gate insulating film; a drain electrode disposed on a second principal surface of the semiconductor substrate; and a third semiconductor region of the second conductivity type, electrically connected to the source electrode. The third semiconductor region is formed to have an impurity concentration higher than that of the first semiconductor region.

In the semiconductor device, the third semiconductor region is disposed in a region beneath a gate pad.

In the semiconductor device, the third semiconductor region is disposed in a region between an active region and an edge termination structure region.

In the semiconductor device, the third semiconductor region is disposed in a region beneath a gate runner.

In the semiconductor device, a portion of a surface of the third semiconductor region is disposed at a position dug down from the surface of the semiconductor layer.

According to another aspect of the present invention, a method of manufacturing a semiconductor device to include a semiconductor substrate of a first conductivity type and comprising silicon carbide; a semiconductor layer of the first conductivity type, formed on a first principal surface of the semiconductor substrate and formed to have an impurity concentration lower than that of the semiconductor substrate; a first semiconductor region of a second conductivity type, formed in a surface region of the semiconductor layer or on a surface of the semiconductor layer; a source region of the first conductivity type, formed in a surface region of the first semiconductor region; a second semiconductor region of the second conductivity type, formed in the surface region of the first semiconductor region and formed to have an impurity concentration higher than that of the first semiconductor region; a source electrode formed to contact the source region and the second semiconductor region; a gate insulating film formed on a surface of the first semiconductor region, at a region between the source region and the semiconductor layer of the first conductivity type adjacent to the first semiconductor region; a gate electrode formed on a surface of the gate insulating film; a drain electrode formed on a second principal surface of the semiconductor substrate; and a third semiconductor region of the second conductivity type, formed to be electrically connected to the source electrode, includes forming the third semiconductor region to have an impurity concentration higher than that of the first semiconductor region.

Other objects, features, and advantages of the present invention are specifically set forth in or will become appar-

BRIEF DESCRIPTION OF THE DRAWINGS

FIG. 5 is a cross-sectional view of an example of the semiconductor device according to a second embodiment of the present invention;

FIG. 6 is a cross-sectional view of an example of the semiconductor device according to a third embodiment of the present invention;

FIG. 7 is a cross-sectional view of an example of the semiconductor device that includes a deep P-type semiconductor region in an active region;

FIG. 8 is a cross-sectional view of a first example of a conventional semiconductor device.

DETAILED DESCRIPTION OF THE INVENTION

Figure 1:
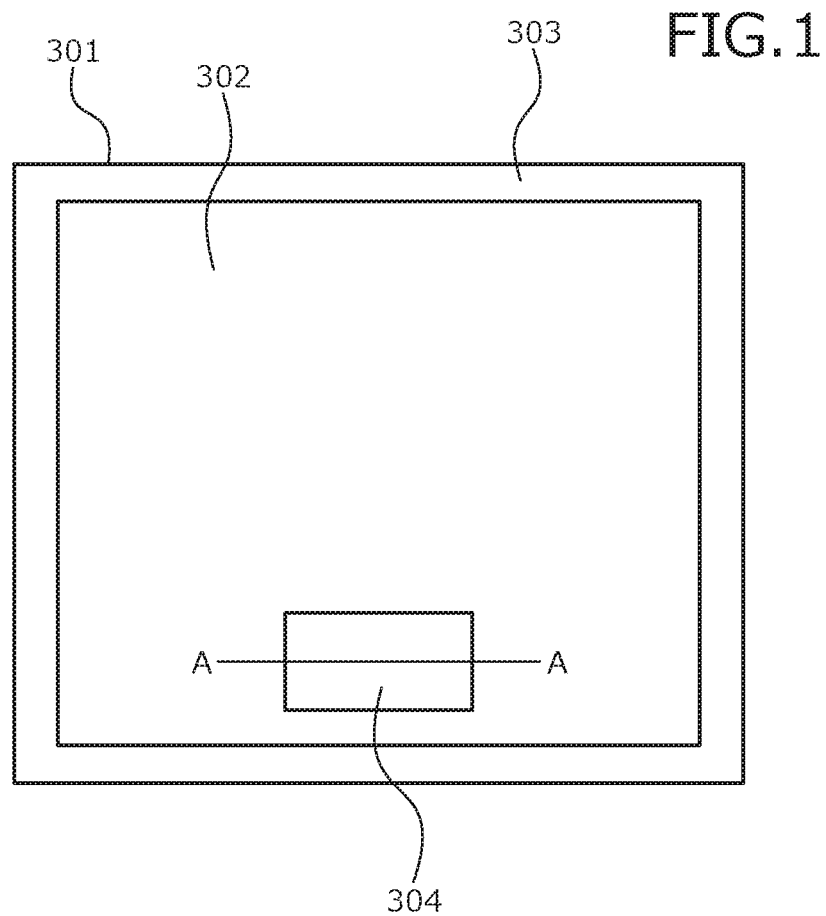
FIG. 1 is a plan diagram of a first example of a layout of a semiconductor device according to a first embodiment of the present invention.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

FIG. 1 is a plan diagram of a first example of a layout of a semiconductor device according to a first embodiment. In FIG. 1, reference numeral "301" denotes a chip of the silicon carbide semiconductor device, reference numeral "302" denotes an active region, reference numeral "303" denotes an edge termination structure region, and reference numeral "304" denotes a gate pad. A MOS structure, that is, an element structure of the semiconductor device is disposed in the active region 302. The edge termination structure region 303 is disposed at a peripheral edge portion of the chip 301 to surround the active region 302. The gate pad 304 is disposed in the active region 302. The arrangement of the gate pad 304 is not limited to that of the example depicted in FIG. 1.

Figure 2:
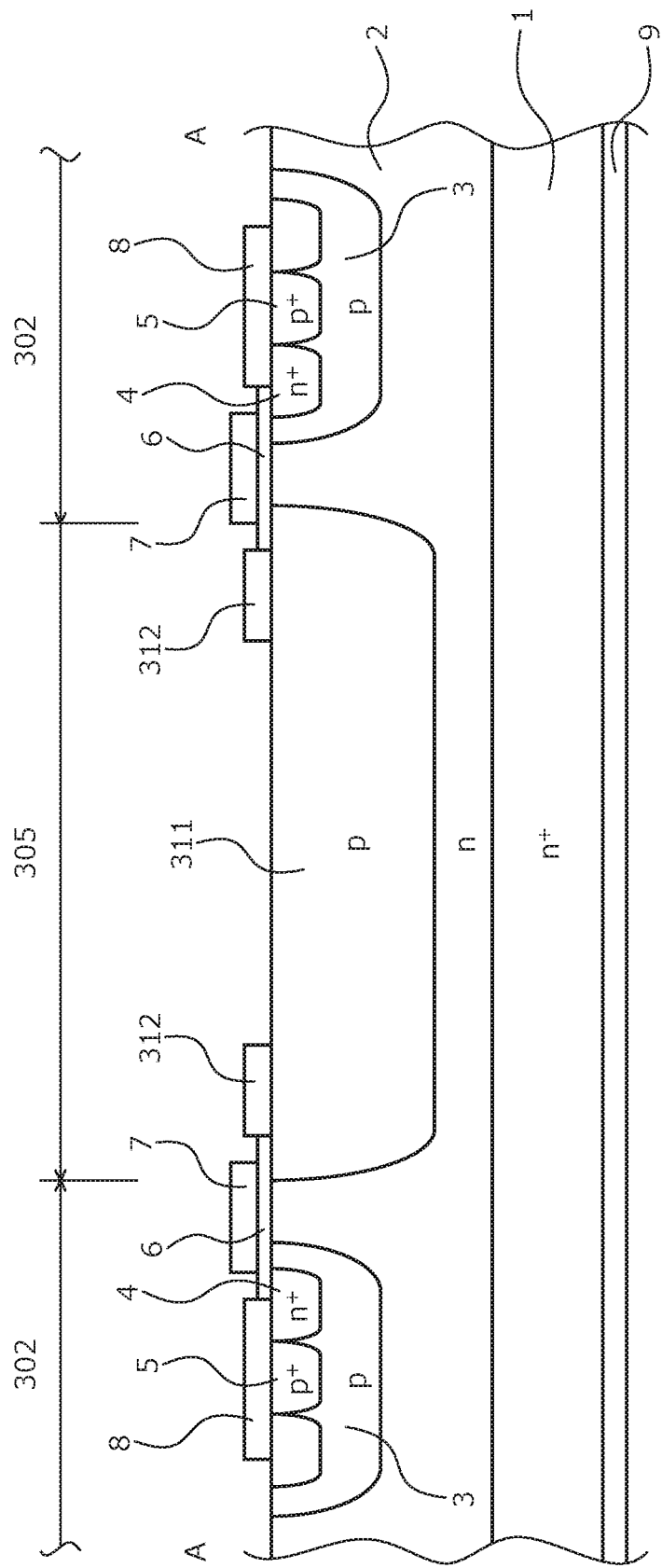
FIG. 2 is a cross-sectional view of an example of the semiconductor device according to the first embodiment.

FIG. 2 is a cross-sectional view of an example of the semiconductor device according to the first embodiment of the present invention. FIG. 2 depicts a cross-sectional view taken along a cutting line A-A in FIG. 1. In FIG. 2, reference numeral "305" denotes a region beneath the gate pad 304 (hereinafter, referred to as "gate pad subjacent region"). The gate pad subjacent region 305 is not included in the active region 302. In FIG. 2, the gate pad 304, and an interlayer insulating film, a source pad, a protective film, and the like that are disposed on a front surface side of the semiconductor device are not depicted.

As depicted in FIG. 2, the semiconductor device includes an $n^+$-type semiconductor substrate 1 and an n-type semiconductor layer 2 that each includes silicon carbide. The $n^+$-type semiconductor substrate 1 may be, for example, a silicon carbide single crystal substrate having an N-type impurity doped in silicon carbide. The $n^+$-type semiconductor substrate 1 forms, for example, a drain region. In the description of this embodiment, the front surface of the $n^+$-type semiconductor substrate 1 is assumed to be a first principal surface and a back surface thereof is assumed to be a second principal surface.

The n-type semiconductor layer 2 is disposed on the first principal surface of the $n^+$-type semiconductor substrate 1. The impurity concentration of the n-type semiconductor layer 2 is lower than that of the $n^+$-type semiconductor substrate 1. The n-type semiconductor layer 2 may be, for example, a semiconductor layer having an N-type impurity doped in silicon carbide. The n-type semiconductor layer 2 forms, for example, an N-type drift layer.

The semiconductor device includes, for example, a p-type first semiconductor region 3, an $n^+$-type source region 4, a $p^+$-type second semiconductor region 5, a gate insulating film 6, a gate electrode 7, and a source electrode 8 as a MOS structure on the side of the first principal surface of the $n^+$-type semiconductor substrate 1. The semiconductor device includes a p-type third semiconductor region 311 and a source electrode 312 in the gate pad subjacent region 305. The semiconductor device includes, for example, a back surface electrode to be a drain electrode 9 on the side of the second principal surface of the $n^+$-type semiconductor substrate 1.

The p-type first semiconductor region 3 is disposed in a portion of the surface region of the n-type semiconductor layer 2. The p-type first semiconductor region 3, for example, may be disposed to sandwich another portion of the surface region of the n-type semiconductor layer 2. A region of the n-type semiconductor layer 2 may be between adjacent p-type first semiconductor regions 3. The p-type first semiconductor region 3 may be, for example, a semiconductor region having a P-type impurity doped in silicon carbide.

The p-type third semiconductor region 311 is disposed in a portion of the surface region of the n-type semiconductor layer 2 in the gate pad subjacent region 305. The p-type third semiconductor region 311 may be disposed to sandwich, for example, a portion of the surface region of the n-type semiconductor layer 2 between the p-type third semiconductor region 311 and the p-type first semiconductor region 3 in the active region 302. A region of the n-type semiconductor layer 2 may be between the p-type third semiconductor region 311 and the p-type first semiconductor region 3. The depth of the p-type third semiconductor region 311 is greater than that of, for example, the p-type first semiconductor region 3. The p-type third semiconductor region 311 may be, for example, a semiconductor region having a P-type impurity doped in silicon carbide. The impurity concentration of the p-type third semiconductor region 311 may be about equal to that of, for example, the p-type first semiconductor region 3.

The $n^+$-type source region 4 is disposed in a surface region of the p-type first semiconductor region 3. In a border region between the active region 302 and the gate pad subjacent region 305, the $n^+$-type source region 4 is disposed away from the region of the n-type semiconductor layer 2 between the p-type first semiconductor region 3 and the p-type third semiconductor region 311. The impurity concentration of the n$^+$-type source region 4 is higher than that of the n-type semiconductor layer 2.

In the surface region of the p-type first semiconductor region 3, the p$^+$-type second semiconductor region 5 is disposed more distant than the n$^+$-type source region 4 from the region of the n-type semiconductor layer 2 between the p-type first semiconductor region 3 and the p-type third semiconductor region 311. The p$^+$-type second semiconductor region 5 contacts the p-type first semiconductor region 3 and the n$^+$-type source region 4. The impurity concentration of the p$^+$-type second semiconductor region 5 is higher than that of the p-type first semiconductor region 3.

The gate insulating film 6 is disposed on the surface of the p-type first semiconductor region 3, at the region sandwiched by the n$^+$-type source region 4 and the n-type semiconductor layer 2 between the p-type first semiconductor region 3 and the p-type third semiconductor region 311. The gate insulating film 6 may extend, for example, from a position on the surface of the p-type first semiconductor region 3 to a position on a surface of an edge portion of the p-type third semiconductor region 311, through a position on the surface of the region of the n-type semiconductor layer 2 between the p-type first semiconductor region 3 and the p-type third semiconductor region 311. The edge portion of the p-type third semiconductor region 311 is positioned in the peripheral portion of the gate pad 304, that is, a terminating end of the active region 302.

The gate electrode 7 is disposed on the surface of the gate insulating film 6. The gate electrode 7 may extend, for example, from a position on the p-type first semiconductor region 3 to a position on the edge portion of the p-type third semiconductor region 311, through a position on the region of the n-type semiconductor layer 2 between the p-type first semiconductor region 3 and the p-type third semiconductor region 311.

The source electrode 8 in the active region 302 is disposed on the surfaces of the n$^+$-type source region 4 and the p$^+$-type second semiconductor region 5 so as to contact the n$^+$-type source region 4 and the p$^+$-type second semiconductor region 5. The source electrode 8 in the active region 302 is electrically connected to the n$^+$-type source region 4 and the p$^+$-type second semiconductor region 5. The source electrode 8 in the active region 302 is insulated from the gate electrode 7 by an interlayer insulating film not depicted.

The source electrode 312 in the gate pad subjacent region 305 is disposed on the surface of the edge portion of the p-type third semiconductor region 311. The source electrode 311 in the gate pad subjacent region 305 is electrically connected to the source electrode 8 in the active region 302. The source electrode 311 in the gate pad subjacent region 305 and the source electrode 8 in the active region 302 may be disposed to be continuous. The source electrode 311 in the gate pad subjacent region 305 is insulated from the gate electrode 7 by an interlayer insulating film not depicted.

The drain electrode 9 is disposed on the second principal surface of the n$^+$-type semiconductor substrate 1. The drain electrode 9 forms an ohmic contact with the n$^+$-type semiconductor substrate 1.

In the semiconductor device having the cross-sectional structure depicted in FIG. 2, the cross-sectional structure of the active region 202 may be like, for example, the cross-sectional structure of the semiconductor device depicted in FIG. 8.

An example of a method of manufacturing a semiconductor device will be described. The n$^+$-type semiconductor substrate 1 including N-type silicon carbide is prepared. The n-type semiconductor layer 2 including silicon carbide is epitaxial-grown on the first principal surface of the n$^+$-type semiconductor substrate 1 while being concurrently doped with an N-type impurity.

A P-type impurity is ion-implanted into the region to be the p-type first semiconductor region 3 of the surface region of the n-type semiconductor layer 2 using a photolithography technique and an ion implantation method. A P-type impurity is ion-implanted into the region to be the p-type third semiconductor region 311 of the surface region of the n-type semiconductor layer 2 using a photolithography technique and an ion implantation method. For example, the dose amount of the ion implantation into the region to be the p-type third semiconductor region 311 may be greater than the dose amount of the ion implantation into the region to be the p-type first semiconductor region 3 such that the p-type third semiconductor region 311 is deeper than the p-type first semiconductor region 3. For example, the acceleration voltage of the ion implantation into the region to be the p-type third semiconductor region 311 may be higher than the acceleration voltage of the ion implantation into the region to be the p-type first semiconductor region 3 such that the p-type third semiconductor region 311 is deeper than the p-type first semiconductor region 3.

An N-type impurity is ion-implanted into the region to be the n$^+$-type source region 4 of the ion-implanted region to be the p-type first semiconductor region 3 using a photolithography technique and an ion implantation method. A P-type impurity is ion-implanted into the region to be the p$^+$-type second semiconductor region 5 of the ion-implanted region to be the p-type first semiconductor region 3 using a photolithography technique and an ion implantation method.

The order of the ion implantation to dispose the p-type first semiconductor region 3, the ion implantation to dispose the p-type third semiconductor region 311, the ion implantation to dispose the n$^+$-type source region 4, and the ion implantation to dispose the p$^+$-type second semiconductor region 5 is not limited to the above order and can be changed variously. When the P-type impurity is ion-implanted into the region to be the p-type first semiconductor region 3, the P-type impurity may be ion-implanted concurrently into the region to be the p-type third semiconductor region 311 and the P-type impurity may be additionally ion-implanted into the region to be the p-type third semiconductor region 311.

The ion-implanted regions to be, for example, the p-type first semiconductor region 3, the p-type third semiconductor region 311, the n$^+$-type source region 4, and the p$^+$-type second semiconductor region 5 are activated by heat treatment (annealing). The ion-implanted regions may collectively be activated by the one heat treatment session as above, or each of the ion-implanted regions may be activated by executing the heat treatment each time the ion implantation is executed.

The surface on the side having the p-type first semiconductor region 3, the n$^+$-type source region 4, the p$^+$-type second semiconductor region 5, and the p-type third semiconductor region 311 disposed thereon is thermally oxidized to dispose the gate insulating film 6 on this entire surface. Unnecessary portions of the gate insulating film 6 are removed using a photolithography technique and an etching technique. The gate electrode 7 is disposed on the gate insulating film 6.

A metal film to become the source electrode 8 is disposed so as to contact the n$^+$-type source region 4 and the p$^+$-type second semiconductor region 5, and a metal film to become the source electrode 312 is disposed in a portion on the first principal surface of the p-type third semiconductor region 311. A metal film to become the drain electrode 9 is disposed on the second principal surface of the n⁺-type semiconductor substrate 1. The source electrode 8, the source electrode 312, and the drain electrode 9 are formed by heat treatment. The n⁺-type semiconductor substrate 1 and the drain electrode 9 form an ohmic contact with each other. As described, the semiconductor device depicted in FIG. 2 is completed.

Figure 9:
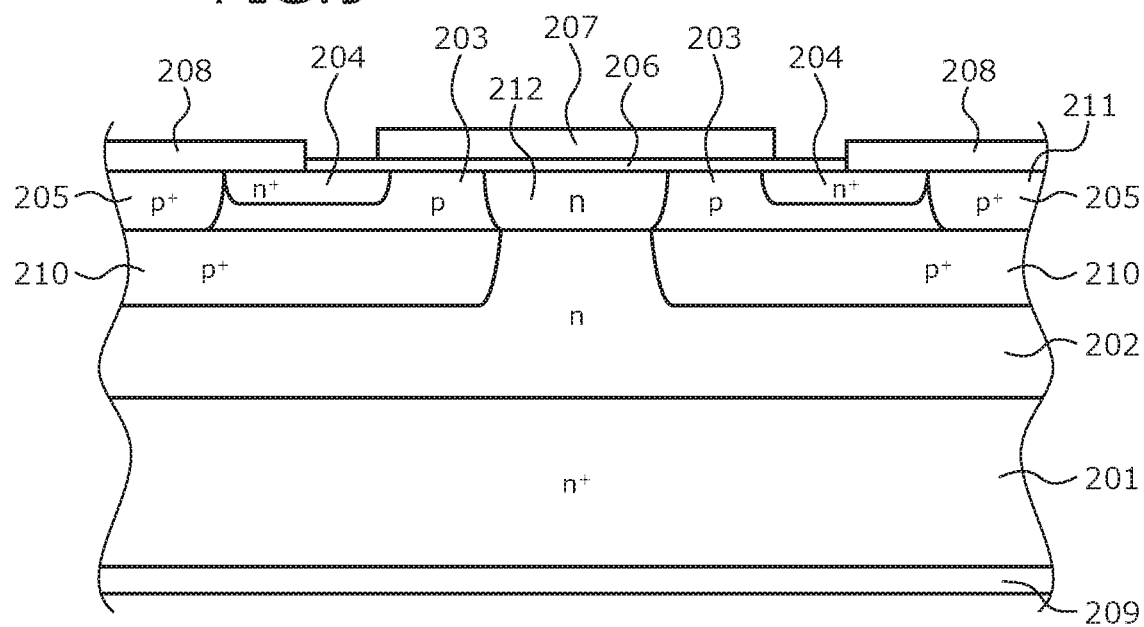
FIG. 9 is a cross-sectional view of a second example of the conventional semiconductor device.

In the semiconductor device having the cross-sectional structure depicted in FIG. 2, the cross-sectional structure of the active region 302 may be like, for example, the cross-sectional structure of the semiconductor device depicted in FIG. 9. In this case, in the cross-sectional structure depicted in FIG. 2, a P-type base region (the p⁺-type base region 210 of FIG. 9) is selectively disposed in the n-type semiconductor layer 2. A P-type silicon carbide semiconductor layer (the p⁺-type silicon carbide semiconductor layer 211 of FIG. 9) is disposed on the surface of the n-type semiconductor layer 2. The p-type first semiconductor region 3, the n⁺-type source region 4, the p⁺-type second semiconductor region 5, and the p-type third semiconductor region 311 are disposed in this P-type silicon carbide semiconductor layer.

It is assumed for each of the semiconductor devices in the above two examples that, when a positive voltage relative to that of the source electrode 8 is applied to the drain electrode 9, a voltage lower than a threshold voltage Vth is applied to the gate electrode 7. In this case, in the semiconductor device having the cross-sectional structure depicted in FIGS. 2 and 8, the PN-junction between the p-type first semiconductor region 3 and the n-type semiconductor layer 2 is reversely biased.

On the other hand, in the semiconductor device having the cross-sectional structure depicted in FIGS. 2 and 8, the PN-junction between the p-type first semiconductor region 3 and the N-type semiconductor region (the n-type type semiconductor region 212 of FIG. 9) is reversely biased. No current therefore flows in any of the semiconductor devices in the two examples.

On the other hand, it is assumed for the semiconductor devices in the two examples that, when a positive voltage relative to that of the source electrode 8 is applied to the drain electrode 9, a voltage equal to or higher than the threshold voltage Vth is applied to the gate electrode 7. In this case, in the semiconductor device having the cross-sectional structure depicted in FIGS. 2 and 8, an inversion layer is formed in the p-type first semiconductor region 3 beneath the gate electrode 7. On the other hand, in the semiconductor device having the cross-sectional structure depicted in FIGS. 2 and 9, an inversion layer is formed in the P-type semiconductor region (the p-type semiconductor region 203 of FIG. 9) beneath the gate electrode 7. Current therefore flows in the semiconductor devices in the two examples. In this manner, the switching operation of each of the semiconductor devices can be executed according to the voltage applied to the gate electrode 7.

Figure 3:
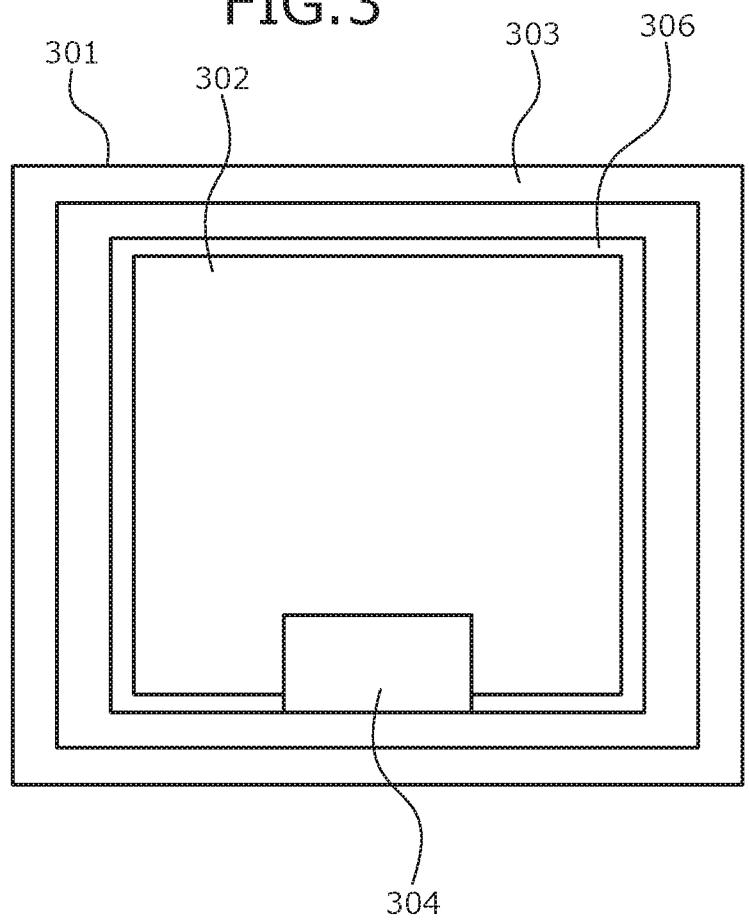
FIG. 3 is a plan diagram of a second example of the layout of the semiconductor device according to the first embodiment.

FIG. 3 is a plan diagram of a second example of the layout of the semiconductor device according to the first embodiment of the present invention. In FIG. 3, reference numeral "306" denotes a region between the active region 302 and the edge termination structure region 303 (hereinafter, referred to as "inter-region" of the active region 302 and the edge termination structure region 303). The inter-region 306 is not included in the active region 302. The inter-region 306 may be disposed to be continuous with, for example, the gate pad subjacent region 305. The arrangement of the gate pad 304 is not limited to the example depicted in FIG. 3.

In the planar layout depicted in FIG. 3, the cross-sectional structure of the gate pad subjacent region 305 depicted in FIG. 2 may be disposed in the inter-region 306. In the planar layout depicted in FIG. 3, the cross-sectional structure of the gate pad subjacent region 305 depicted in FIG. 2 may be disposed in both of the inter-region 306, and the gate pad subjacent region 305.

Figure 4:
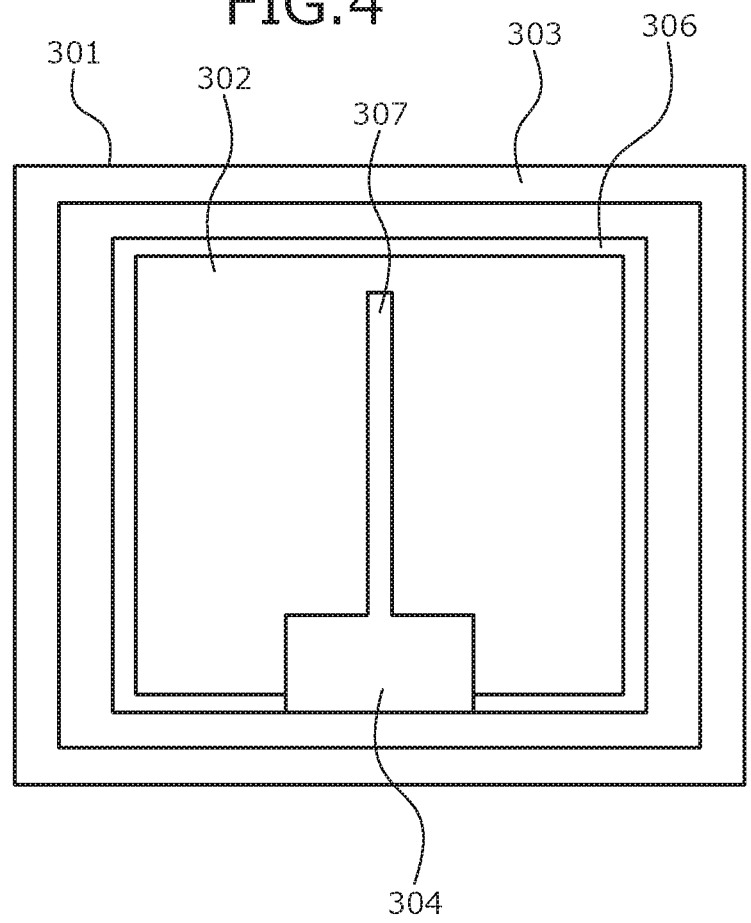
FIG. 4 is a plan diagram of a third example of the layout of the semiconductor device according to the first embodiment.

FIG. 4 is a plan diagram of a third example of the layout of the semiconductor device according to the first embodiment of the present invention. In FIG. 4, reference numeral "307" denotes a gate runner. In the active region 302, the gate runner 307 extends, for example, from the gate pad 304 to the vicinity of the opposite side of the active region 302. The region beneath the gate runner 307 is not included in the active region 302. The arrangement of the gate pad 304 and the gate runner 307 is not limited to the example depicted in FIG. 4.

In the planar layout depicted in FIG. 4, the cross-sectional structure of the gate pad subjacent region 305 depicted in FIG. 2 may be disposed in the region beneath the gate runner 307. In the planar layout depicted in FIG. 4, the cross-sectional structure of the gate pad subjacent region 305 depicted in FIG. 2 may be disposed in both the region beneath the gate runner 307 and the gate pad subjacent region 305. In the planar layout depicted in FIG. 4, the cross-sectional structure of the gate pad subjacent region 305 depicted in FIG. 2 may be disposed in each of the region beneath the gate runner 307, the gate pad subjacent region 305, and the inter-region 306.

According to the first embodiment, because the p-type third semiconductor region 311 that is deeper than the p-type first semiconductor region 3 is disposed, avalanche occurs in the PN-junction portion between the p-type third semiconductor region 311 and the n-type semiconductor layer 2 when a high voltage is applied to the drain electrode 9. In the active region 302, the occurrence of an avalanche is thereby suppressed in, for example, a vicinity of the gate insulating film 6 and application of a high electric field to the gate insulating film 6 is therefore suppressed. Therefore, the resistance to breakdown of the gate insulating film 6 may be improved. The reliability of the gate insulating film 6 may also be improved.

FIG. 5 is a cross-sectional view of an example of the semiconductor device according to a second embodiment of the present invention. As depicted in FIG. 5, in the semiconductor device according to the second embodiment, the depth of the p⁺-type third semiconductor region 311 is about equal to the depth of the p-type first semiconductor region 3, and the impurity concentration of the p⁺-type third semiconductor region 311 is higher than that of the p-type first semiconductor region 3. Other configurations and the method of manufacture are the same as those of the first embodiment and will not again be described. The dose amount and the acceleration voltage of the ion implantation into the region to be the p⁺-type third semiconductor region 311 are, however, adjusted such that the depth of the p⁺-type third semiconductor region 311 is about equal to that of the p-type first semiconductor region 3 and the impurity concentration of the p⁺-type third semiconductor region 311 is higher than that of the p-type first semiconductor region 3.

Similar to the first embodiment, the planar layout of the semiconductor device according to the second embodiment may be any one of the layouts depicted in FIGS. 1, 3, and 4. In the case of the planar layout depicted in FIG. 1, the p⁺-type third semiconductor region 311 and the source region 312 in the cross-sectional structure depicted in FIG. 5 are disposed in the gate pad subjacent region 305. In the case of the planar layout depicted in FIG. 3, the p$^+$-type third semiconductor region 311 and the source region 312 in the cross-sectional structure depicted in FIG. 5 may be disposed in one of or both the inter-region 306 and the gate pad subjacent region 305. In the case of the planar layout depicted in FIG. 4, the p$^+$-type third semiconductor region 311 and the source region 312 in the cross-sectional structure depicted in FIG. 5 may be disposed in any one, any two, or all of the region beneath the gate runner 307, the inter-region 306, and the gate pad subjacent region 305.

According to the second embodiment, because the p$^+$-type third semiconductor region 311 having an impurity concentration higher than that of the p-type first semiconductor region 3 is disposed, avalanche occurs in the PN-junction portion between the p$^+$-type third semiconductor region 311 and the n-type semiconductor layer 2 when a high voltage is applied to the drain electrode 9. In the active region 302, the occurrence of an avalanche is thereby suppressed in, for example, the vicinity of the gate insulating film 6 and application of a high electric field to the gate insulating film 6 is therefore suppressed. Therefore, the resistance to breakdown of the gate insulating film 6 may be improved. The reliability of the gate insulating film 6 may also be improved.

FIG. 6 is a cross-sectional view of an example of the semiconductor device according to a third embodiment of the present invention. As depicted in FIG. 6, in the semiconductor device according to the third embodiment, a portion of the surface of the p-type third semiconductor region 311 is disposed at a position dug down from the surface of the n-type semiconductor layer 2 in the active region 302. For example, the surface of the p-type third semiconductor region 311 may be dug down in the region between the source electrodes 312. The depth of the p-type third semiconductor region 311 is greater than that of the p-type first semiconductor region 3 by a depth corresponding to the depth by which the surface of the p-type third semiconductor region 311 is dug down from the surface of the n-type semiconductor layer 2. The impurity concentration of the p-type third semiconductor region 311 may be about equal to that of the p-type first semiconductor region 3 or may be higher than that of the p-type first semiconductor region 3. Other configurations and the method of manufacture are the same as those of the first embodiment and will not again be described. The surface of the region to be the p-type third semiconductor region 311 of the n-type semiconductor layer 2 is, however, dug down using etching or the like before executing the ion implantation of a P-type impurity into the region to be the p-type third semiconductor region 311.

Similar to the first embodiment, the planar layout of the semiconductor device according to the third embodiment may be any one of the layouts depicted in FIGS. 1, 3, and 4. In the case of the planar layout depicted in FIG. 1, the p-type third semiconductor region 311 and the source region 312 in the cross-sectional structure depicted in FIG. 6 are disposed in the gate pad subjacent region 305. In the case of the planar layout depicted in FIG. 3, the p-type third semiconductor region 311 and the source region 312 in the cross-sectional structure depicted in FIG. 6 may be disposed in one of or both the inter-region 306 and the gate pad subjacent region 305. In the case of the planar layout depicted in FIG. 4, the p-type third semiconductor region 311 and the source region 312 in the cross-sectional structure depicted in FIG. 6 may be disposed in any one, any two, or all of the region beneath the gate runner 307, the inter-region 306, and the gate pad subjacent region 305.

According to the third embodiment, because the p-type third semiconductor region 311 that is deeper than the p-type first semiconductor region 3 is disposed, avalanche occurs in the PN-junction portion between the p-type third semiconductor region 311 and the n-type semiconductor layer 2 when a high voltage is applied to the drain electrode 9. In the active region 302, the occurrence of an avalanche is thereby suppressed in, for example, the vicinity of the gate insulating film 6 and application of a high electric field to the gate insulating film 6 is therefore suppressed. Therefore, the resistance to breakdown of the gate insulating film 6 may be improved. The reliability of the gate insulating film 6 may also be improved. According to the third embodiment, the diffusion region deeper than the p-type first semiconductor region 3 may be easily formed by executing the ion implantation after digging down the surface of the n-type semiconductor layer 2.

FIG. 7 is a cross-sectional view of an example of the semiconductor device that includes a deep P-type semiconductor region in the active region. It is considered that a p$^+$-type semiconductor region 10 deeper than the p-type first semiconductor region 3 is disposed in the active region as depicted in FIG. 7, as an improvement measure against the occurrence of dielectric breakdown of the gate insulating film and significant degradation of the reliability of the gate insulating film consequent to the application of a high electric field to the gate insulating film in the active region. When the p$^+$-type semiconductor region 10 deeper than the p-type first semiconductor region 3 is disposed in the active region, however, the resistance of the p-type first semiconductor region 3 is increased and a problem therefore occurs that the forward voltage is increased. According to the first to the third embodiments, increase of the resistance of the p-type first semiconductor region 3 may be prevented and increase of the forward voltage may be suppressed because a p$^+$-type semiconductor region deeper than the p-type first semiconductor region 3 does not need to be disposed in the active region.

However, with the conventional semiconductor devices, in a case where a metal oxide semiconductor field-effect transistor (MOSGET) is turned off such as, for example, when switching is executed, the n-type silicon carbide semiconductor layer is at a high voltage when a high voltage is applied to the drain electrode. In this case, because a high electric field is applied to the gate insulating film between the n-type silicon carbide semiconductor layer and the gate electrode, problems arise in that dielectric breakdown of the gate insulating film may occur and the reliability of the gate insulating film may be degraded significantly.

According to the present invention, application of a high electric field to the gate insulating film is suppressed because an avalanche occurs beneath the third semiconductor region when a high voltage is applied to the drain electrode. Further, the occurrence of an avalanche may be suppressed in a vicinity of the gate insulating film. The third semiconductor region is disposed to be deeper than the first semiconductor region because a deep diffusion layer may be formed easily in the semiconductor layer because the surface of the semiconductor layer is dug down.

According to the present invention, the resistance to breakdown of the gate insulating film may be improved, and the reliability of the gate insulating film may be improved.

In the description above, the present invention is not limited to the embodiments and may be changed variously. For example, although the first conductivity type is the N type and the second conductivity type is the P type in the embodiments, the present invention also applicable when the first conductivity type is the P type and the second conductivity type is the N type.

As described above, the present invention is useful for a semiconductor device that may be used as, for example, a switching device disposed on a silicon carbide substrate and is especially suitable for a semiconductor device such as a vertical MOSFET that includes silicon carbide.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
    a semiconductor substrate of a first conductivity type, having a first principal surface and a second principal surface;
    a semiconductor layer of the first conductivity type, disposed on the first principal surface of the semiconductor substrate, the semiconductor layer having an impurity concentration lower than that of the semiconductor substrate;
    a first semiconductor region of a second conductivity type, disposed in the semiconductor layer at a surface thereof;
    a source region of the first conductivity type, disposed in the first semiconductor region at a surface thereof;
    a second semiconductor region of the second conductivity type, disposed in the first semiconductor region at the surface thereof, the second semiconductor region having an impurity concentration higher than that of the first semiconductor region;
    a source electrode disposed to contact the source region and the second semiconductor region;
    a gate insulating film disposed on the surface of the semiconductor layer, and covering a portion of the first semiconductor region between the source region and the semiconductor layer adjacent to the first semiconductor region;
    a gate electrode disposed on a surface of the gate insulating film; a drain electrode disposed on the second principal surface of the semiconductor substrate; and
    a third semiconductor region of the second conductivity type, formed in the semiconductor layer at the surface thereof and being electrically connected to the source electrode, the entire third semiconductor region having an impurity concentration higher than that of the first semiconductor region, a depth of the third semiconductor region being the same as that of the first semiconductor region.

2. The semiconductor device according to claim 1, further comprising
    an active region, and
    a gate pad disposed in the active region, wherein
    the third semiconductor region is disposed in a region beneath the gate pad.

3. The semiconductor device according to claim 1, further comprising
    an active region, and
    an edge termination structure region surrounding the active region, wherein
    the third semiconductor region is disposed in a region between the active region and the edge termination structure region.

4. The semiconductor device according to claim 1, further comprising
    an active region,
    a gate pad disposed in the active region, and
    a gate runner extending from the gate pad, wherein
    the third semiconductor region is disposed in a region beneath the gate runner.

5. The semiconductor device according to claim 1, wherein the semiconductor substrate is formed of silicon carbide.

6. A method of manufacturing a semiconductor device, comprising:
    providing a semiconductor substrate of a first conductivity type, having a first principal surface and a second principal surface,
    forming a semiconductor layer of the first conductivity type on the first principal surface of the semiconductor substrate, the semiconductor layer having an impurity concentration lower than that of the semiconductor substrate;
    forming a first semiconductor region of a second conductivity type in the semiconductor layer at a surface thereof;
    forming a source region of the first conductivity type in the first semiconductor region at a surface thereof;
    forming a second semiconductor region of the second conductivity type in the first semiconductor region at the surface thereof, the second semiconductor region having an impurity concentration higher than that of the first semiconductor region; and
    forming a third semiconductor region in the semiconductor layer at the surface thereof, and electrically connecting the third semiconductor region to the source electrode, the third semiconductor region being of the second conductivity type, and the entire third semiconductor region having an impurity concentration higher than that of the first semiconductor region, a depth of the third semiconductor region being the same as that of the first semiconductor region.

7. The method of claim 6, further comprising:
    forming a source electrode in contact with the source region and the second semiconductor region;
    forming a gate insulating film on a surface of the semiconductor layer, to cover a portion of the first semiconductor region between the source region and the semiconductor layer adjacent to the first semiconductor region;
    forming a gate electrode on a surface of the gate insulating film; and
    forming a drain electrode on the second principal surface of the semiconductor substrate.

8. The method of claim 6, wherein the semiconductor substrate is formed of silicon carbide.

* * * * *